United States Patent
Lee et al.

(10) Patent No.: US 11,246,229 B2
(45) Date of Patent: Feb. 8, 2022

(54) ELECTRONIC COMPONENT ARRANGEMENT STRUCTURE AND ELECTRONIC DEVICE INCLUDING SAME

(71) Applicant: Samsung Electronics Co., Ltd., Gyeonggi-do (KR)

(72) Inventors: Sunghyup Lee, Gyeonggi-do (KR); Sangmin Kim, Gyeonggi-do (KR); Daeyoung Noh, Gyeonggi-do (KR); Jungsik Park, Gyeonggi-do (KR); Minchang Shim, Gyeonggi-do (KR); Seunghoon Lee, Gyeonggi-do (KR); Heeseok Jung, Gyeonggi-do (KR); Seungki Choi, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/793,664

(22) Filed: Feb. 18, 2020

(65) Prior Publication Data
US 2020/0267847 A1    Aug. 20, 2020

(30) Foreign Application Priority Data

Feb. 19, 2019 (KR) .......................... 10-2019-0019475

(51) Int. Cl.
*H05K 5/00* (2006.01)
*H04B 1/3827* (2015.01)
(Continued)

(52) U.S. Cl.
CPC ........... *H05K 5/006* (2013.01); *H04B 1/3833* (2013.01); *H04B 1/40* (2013.01); *H05K 5/0017* (2013.01); *H05K 5/0247* (2013.01)

(58) Field of Classification Search
CPC .... H05K 5/006; H05K 5/0017; H05K 5/0065; H05K 5/0069; H05K 5/0247; H05K 1/141; H04B 1/40; H04B 1/3833
See application file for complete search history.

(56) References Cited

U.S. PATENT DOCUMENTS 9,545,764 B2 * 1/2017 Allore ..................... H05K 5/03
10,594,023 B2   3/2020 Jeon et al.
(Continued)

FOREIGN PATENT DOCUMENTS

CN    107766804    3/2018
JP    4803688      8/2011
(Continued)

OTHER PUBLICATIONS

International Search Report dated May 21, 2020 issued in counterpart application No. PCT/KR2020/001809, 3 pages.
(Continued)

*Primary Examiner* — Mukundbhai G Patel
(74) *Attorney, Agent, or Firm* — The Farrell Law Firm, P.C.

(57) ABSTRACT

An electronic device is provided. The electronic device includes a housing including a front plate, a rear plate facing in a direction opposite the front plate, and a side member including a support member surrounding a space between the front plate and the rear plate and at least partially extending to the space; a printed circuit board disposed between the rear plate and the support member; an electrical structure disposed around the printed circuit board and includes at least one extension portion at least partially overlapping the printed circuit board when the front plate is viewed from above; and at least one fastening member configured to simultaneously pass through the at least one extension portion and the printed circuit board and fasten to the support member.

20 Claims, 14 Drawing Sheets

(51) Int. Cl.
*H04B 1/40* (2015.01)
*H05K 5/02* (2006.01)

(56) References Cited

U.S. PATENT DOCUMENTS

| | | | |
|---|---|---|---|
| 10,651,542 | B2 | 5/2020 | Choi et al. |
| 2013/0109329 | A1 | 5/2013 | Na et al. |
| 2014/0273632 | A1 | 9/2014 | Kim et al. |
| 2017/0033797 | A1* | 2/2017 | Jung .................... H05K 1/189 |
| 2017/0094818 | A1 | 3/2017 | Kim et al. |
| 2017/0111077 | A1* | 4/2017 | Hwang ................. H01Q 1/243 |
| 2017/0133748 | A1 | 5/2017 | Kim et al. |
| 2017/0170562 | A1 | 6/2017 | Lee et al. |
| 2017/0171960 | A1 | 6/2017 | Yang |
| 2018/0331418 | A1 | 11/2018 | Klm et al. |
| 2019/0013687 | A1 | 1/2019 | Shevde et al. |

FOREIGN PATENT DOCUMENTS

| | | |
|---|---|---|
| KR | 2013-0048610 | 5/2013 |
| KR | 1020170053401 | 5/2017 |
| KR | 1020180027802 | 3/2018 |
| KR | 10-1909604 | 10/2018 |
| KR | 1020180124621 | 11/2018 |
| KR | 1020190098527 | 8/2019 |

OTHER PUBLICATIONS

European Search Report dated Jun. 16, 2020 issued in counterpart application No. 20157969.5-1216, 7 pages.

* cited by examiner

ELECTRONIC COMPONENT ARRANGEMENT STRUCTURE AND ELECTRONIC DEVICE INCLUDING SAME

CROSS-REFERENCE TO RELATED APPLICATION(S)

This application is based on and claims priority under 35 U.S.C. § 119 to Korean Patent Application No. 10-2019-0019475, filed on Feb. 19, 2019, in the Korean Intellectual Property Office, the disclosure of which is incorporated herein by reference in its entirety.

BACKGROUND

1. Field

The present disclosure relates to an electronic component arrangement structure and an electronic device including the same.

2. Description of Related Art

As the functional gap between manufacturers has been significantly reduced, electronic devices are becoming slimmer in order to meet consumer's purchasing needs. Electronic devices are being developed to increase rigidity thereof, enhance design aspects, and differentiate their functional elements.

A plurality of electronic components arranged in the internal space of the electronic device may be helpful for the slimming of the electronic device only when the plurality of electronic components is efficiently arranged with each other. In addition, if the functions of the plurality of electronic components are not properly exhibited even though the plurality of electronic components are efficiently arranged in the internal space of the electronic device, it may cause deterioration of the electronic device. Therefore, the components of the electronic devices are being developed to satisfy all of these conditions.

An electronic device may include a plurality of electronic components arranged so that functions may be sufficiently exhibited in an internal space. Such electronic components may include a printed circuit board (PCB), a display, various elements, various sensors, or an interface connector module (an intermediate frequency (IF) module, e.g., an interface connector port) exposed to an external environment. In particular, an IF module may be disposed on a same plane separately from a PCB in an internal space of an electronic device, which may cause a component mounting space of the PCB to be narrowed. In addition, since a PCB and an IF module should be individually fixed by separate fastening members (e.g., screws) in an internal space of an electronic device, mounting efficiency may decrease and manufacturing cost may increase.

An electronic device may include a conductive member disposed on at least a portion of a side member for the purpose of rigid reinforcement. At least some conductive portions of a conductive member may be utilized as an antenna. An electronic device is increasingly required to have a full front display, and accordingly, a bezel area may be gradually reduced. Thus, when an IF module, which may be a metal electrical material, is disposed close to a conductive portion of a side member utilized as an antenna as a bezel area is reduced, the IF module may degrade the performance of the antenna. Furthermore, by a separate arrangement of an IF module and a PCB, the PCB with reduced mounting efficiency may be limited in an area of electrical connection with a conductive portion utilized as an antenna.

SUMMARY

In accordance with an aspect of the present disclosure, an electronic device is provided. The electronic device includes a housing including a front plate, a rear plate facing in a direction opposite the front plate, and a side member including a support member surrounding a space between the front plate and the rear plate and at least partially extending to the space; a printed circuit board disposed between the rear plate and the support member; an electrical structure disposed around the printed circuit board and including at least one extension portion at least partially overlapping the printed circuit board when the front plate is viewed from above; and at least one fastening member configured to simultaneously pass through the at least one extension portion and the printed circuit board and fasten to the support member.

In accordance with another aspect of the present disclosure, an electronic device is provided. The electronic device includes a side member including a support member at least partially extending from a side surface to an internal space of the electronic device; a printed circuit disposed to be supported by the support member in the internal space; an IF module disposed around the printed circuit board and including at least one extension portion at least partially overlapping the printed circuit board; and at least one fastening member configured to simultaneously pass through the at least one extension portion and the printed circuit board and fasten to the support member, wherein the at least one fastening member is disposed in an overlapping region where the at least one extension portion and the printed circuit board overlap each other.

BRIEF DESCRIPTION OF THE DRAWINGS

The above and other aspects, features, and advantages of the present disclosure will be more apparent from the following description taken in conjunction with the accompanying drawings, in which.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions are omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
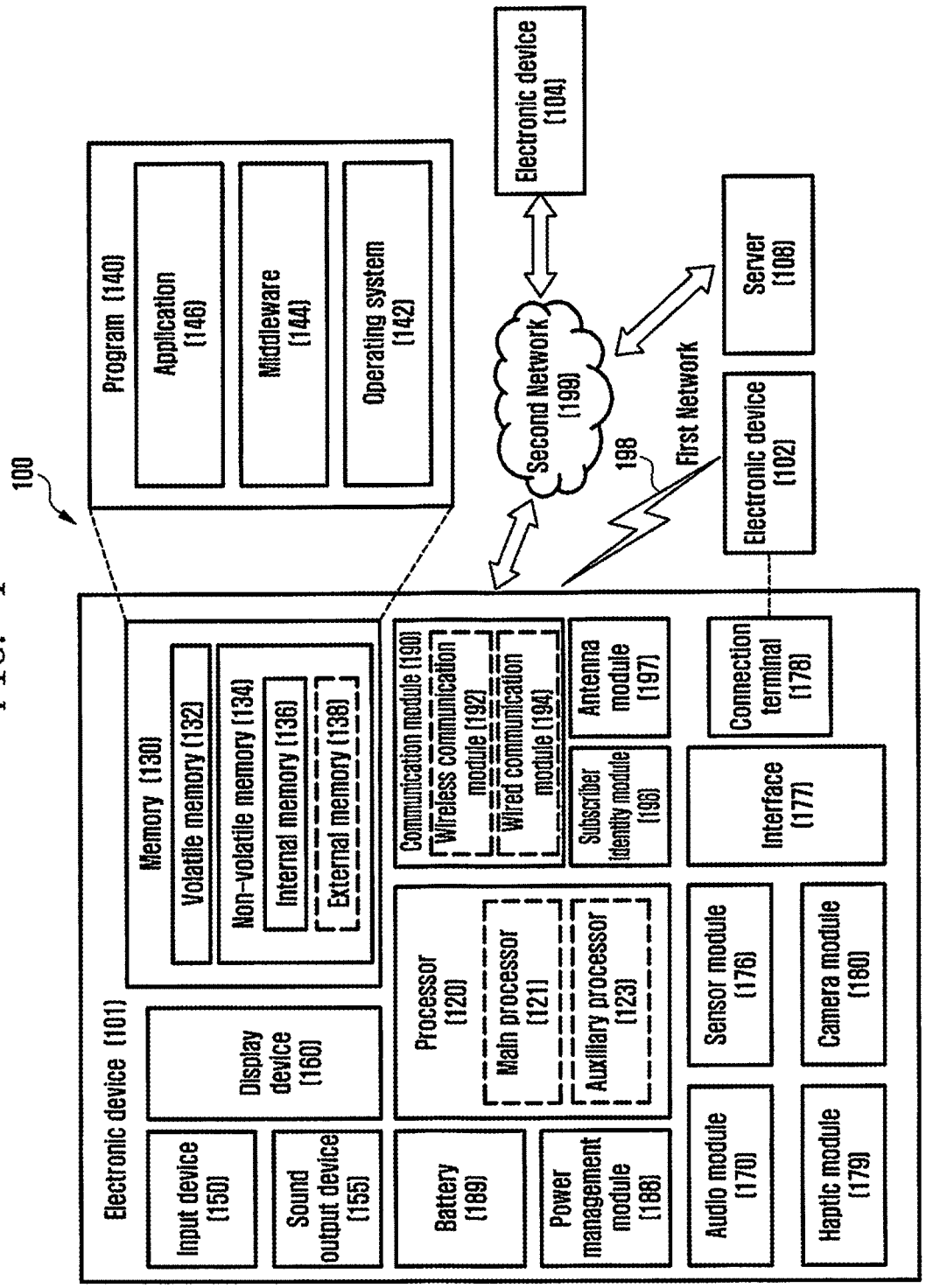
FIG. 1 is a block diagram illustrating an electronic device in a network environment according to an of the disclosure.

FIG. 1 illustrates an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input device 150, an audio output device 155, a display device 160, an audio module 170, a sensor module 176, an interface 177, a haptic module 179, a camera module 180, a power management module 188, a battery 189, a communication module 190, a subscriber identity module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 or external memory 138.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The audio output device 155 may output sound signals to the outside of the electronic device 101. The audio output device 155 may include, for example, a speaker or a receiver. The speaker may be used for general purposes, such as playing multimedia or playing record, and the receiver may be used for an incoming calls. The receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the audio output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). The connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, image signal processors, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or a standard of the Infrared Data Association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., a PCB). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device according to an embodiment may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment.

With regard to the description of the drawings, similar reference numerals may be used to refer to similar or related elements.

A singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases.

As used herein, such terms as "1st" and "2nd", or "first" and "second" may be used to simply distinguish a corresponding component from another, and does not limit the components in other aspect (e.g., importance or order). If an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2A:
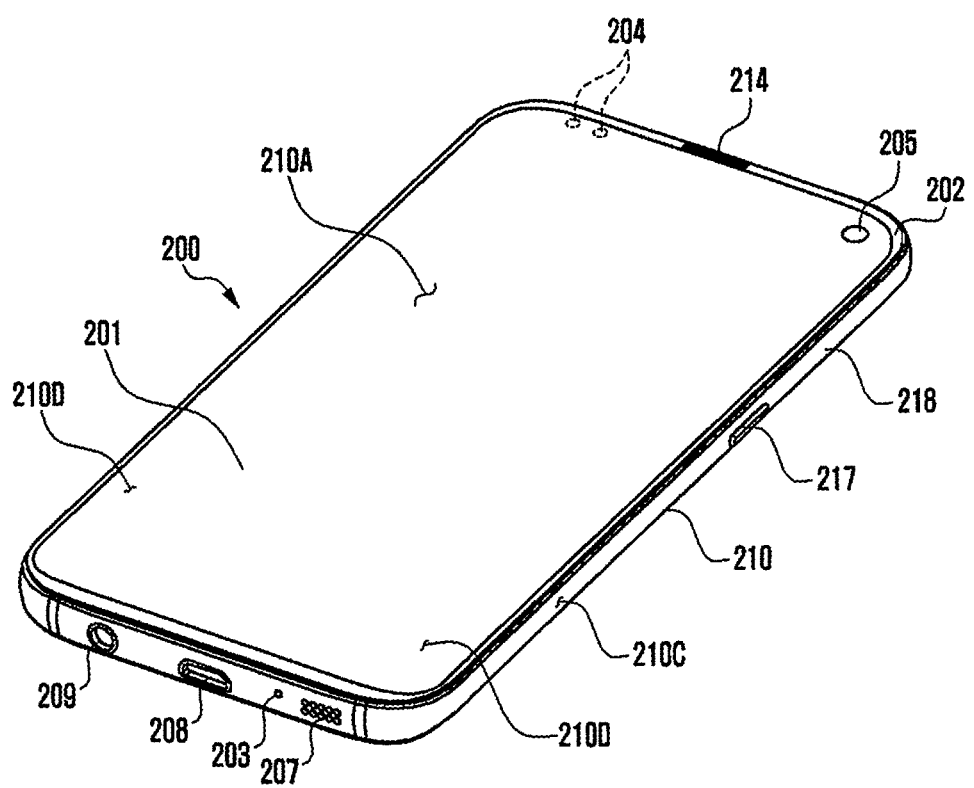
FIG. 2A is a perspective view illustrating a mobile electronic device according to an embodiment of the disclosure.
Figure 2B:
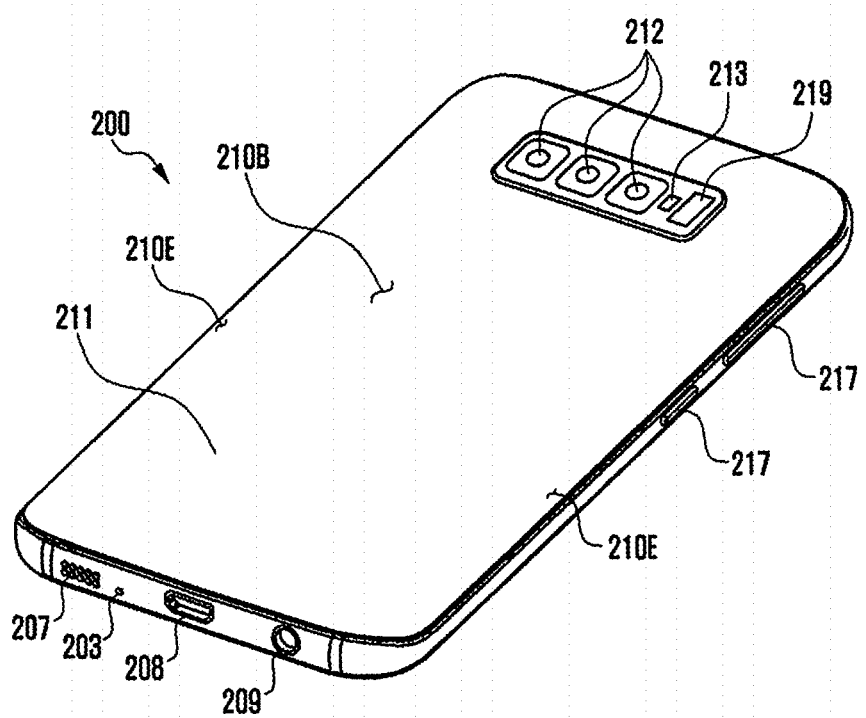
FIG. 2B is a perspective view illustrating a rear surface of a mobile electronic device according to an embodiment of the disclosure.

FIG. 2A illustrates a perspective view showing a front surface of a mobile electronic device 200 according to an embodiment, and FIG. 2B illustrates a perspective view showing a rear surface of the mobile electronic device 200 shown in FIG. 2A.

Referring to FIGS. 2A and 2B, the mobile electronic device 200 may include a housing 210 that includes a first surface (or front surface) 210A, a second surface (or rear surface) 210B, and a lateral surface 210C that surrounds a space between the first surface 210A and the second surface 210B. The housing 210 may refer to a structure that forms a part of the first surface 210A, the second surface 210B, and the lateral surface 210C. The first surface 210A may be formed of a front plate 202 (e.g., a glass plate or polymer plate coated with a variety of coating layers) at least a part of which is substantially transparent. The second surface 210B may be formed of a rear plate 211 which is substantially opaque. The rear plate 211 may be formed of, for example, coated or colored glass, ceramic, polymer, metal (e.g., aluminum, stainless steel (STS), or magnesium), or any combination thereof. The lateral surface 210C may be formed of a lateral bezel structure (or "lateral member") 218 which is combined with the front plate 202 and the rear plate 211 and includes a metal and/or polymer. The rear plate 211 and the lateral bezel structure 218 may be integrally formed and may be of the same material (e.g., a metallic material such as aluminum).

The front plate 202 may include two first regions 210D disposed at long edges thereof, respectively, and bent and extended seamlessly from the first surface 210A toward the rear plate 211. Similarly, the rear plate 211 may include two second regions 210E disposed at long edges thereof, respectively, and bent and extended seamlessly from the second surface 210B toward the front plate 202. The front plate 202 (or the rear plate 211) may include only one of the first regions 210D (or of the second regions 210E). The first regions 210D or the second regions 210E may be omitted in part. When viewed from a lateral side of the mobile electronic device 200, the lateral bezel structure 218 may have a first thickness (or width) on a lateral side where the first region 210D or the second region 210E is not included, and may have a second thickness, being less than the first thickness, on another lateral side where the first region 210D or the second region 210E is included.

The mobile electronic device 200 may include at least one of a display 201, audio modules 203, 207 and 214, sensor modules 204 and 219, camera modules 205, 212 and 213, a key input device 217, a light emitting device, and connector holes 208 and 209. The mobile electronic device 200 may omit at least one (e.g., the key input device 217 or the light emitting device) of the above components, or may further include other components.

The display 201 may be exposed through a substantial portion of the front plate 202, for example. At least a part of the display 201 may be exposed through the front plate 202 that forms the first surface 210A and the first region 210D of the lateral surface 210C. Outlines (i.e., edges and corners) of the display 201 may have substantially the same form as those of the front plate 202. The spacing between the outline of the display 201 and the outline of the front plate 202 may be substantially unchanged in order to enlarge the exposed area of the display 201.

A recess or opening may be formed in a portion of a display area of the display 201 to accommodate at least one of the audio module 214, the sensor module 204, the camera module 205, and the light emitting device. At least one of the audio module 214, the sensor module 204, the camera module 205, the fingerprint sensor (not shown), and the light emitting element may be disposed on the back of the display area of the display 201. The display 201 may be combined with, or adjacent to, a touch sensing circuit, a pressure sensor capable of measuring the touch strength (pressure), and/or a digitizer for detecting a stylus pen. At least a part of the sensor modules 204 and 219 and/or at least a part of the key input device 217 may be disposed in the first region 210D and/or the second region 210E.

The audio modules 203, 207 and 214 may correspond to a microphone hole 203 and speaker holes 207 and 214, respectively. The microphone hole 203 may contain a microphone disposed therein for acquiring external sounds and, in a case, contain a plurality of microphones to sense a sound direction. The speaker holes 207 and 214 may be classified into an external speaker hole 207 and a call receiver hole 214. The microphone hole 203 and the speaker holes 207 and 214 may be implemented as a single hole, or a speaker (e.g., a piezo speaker) may be provided without the speaker holes 207 and 214.

The sensor modules 204 and 219 may generate electrical signals or data corresponding to an internal operating state of the mobile electronic device 200 or to an external environmental condition. The sensor modules 204 and 219 may include a first sensor module 204 (e.g., a proximity sensor) and/or a second sensor module (e.g., a fingerprint sensor) disposed on the first surface 210A of the housing 210, and/or a third sensor module 219 (e.g., a heart rate monitor (HRM) sensor) and/or a fourth sensor module (e.g., a fingerprint sensor) disposed on the second surface 210B of the housing 210. The fingerprint sensor may be disposed on the second surface 210B as well as the first surface 210A (e.g., the display 201) of the housing 210. The electronic device 200 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205, 212 and 213 may include a first camera device 205 disposed on the first surface 210A of the electronic device 200, and a second camera device 212 and/or a flash 213 disposed on the second surface 210B. The camera module 205 or the camera module 212 may include one or more lenses, an image sensor, and/or an image signal processor. The flash 213 may include, for example, a light emitting diode or a xenon lamp. Two or more lenses (infrared cameras, wide angle and telephoto lenses) and image sensors may be disposed on one side of the electronic device 200.

The key input device 217 may be disposed on the lateral surface 210C of the housing 210. The mobile electronic device 200 may not include some or all of the key input device 217 described above, and the key input device 217 which is not included may be implemented in another form such as a soft key on the display 201. The key input device 217 may include the sensor module disposed on the second surface 210B of the housing 210.

The light emitting device may be disposed on the first surface 210A of the housing 210. For example, the light emitting device may provide status information of the electronic device 200 in an optical form. The light emitting device may provide a light source associated with the operation of the camera module 205. The light emitting device may include, for example, a light emitting diode (LED), an IR LED, or a xenon lamp.

The connector holes 208 and 209 may include a first connector hole 208 adapted for a connector (e.g., a USB connector) for transmitting and receiving power and/or data to and from an external electronic device, and/or a second connector hole 209 adapted for a connector (e.g., an earphone jack) for transmitting and receiving an audio signal to and from an external electronic device.

Some sensor modules 205 of camera modules 205 and 212, some sensor modules 204 of sensor modules 204 and 219, or an indicator may be arranged to be exposed through a display 201. For example, the camera module 205, the sensor module 204, or the indicator may be arranged in the internal space of an electronic device 200 so as to be brought into contact with an external environment through an opening of the display 201, which is perforated up to a front plate 202. In another embodiment, some sensor modules 204 may be arranged to perform their functions without being visually exposed through the front plate 202 in the internal space of the electronic device. For example, in this case, an area of the display 201 facing the sensor module may not require a perforated opening.

Figure 2C:
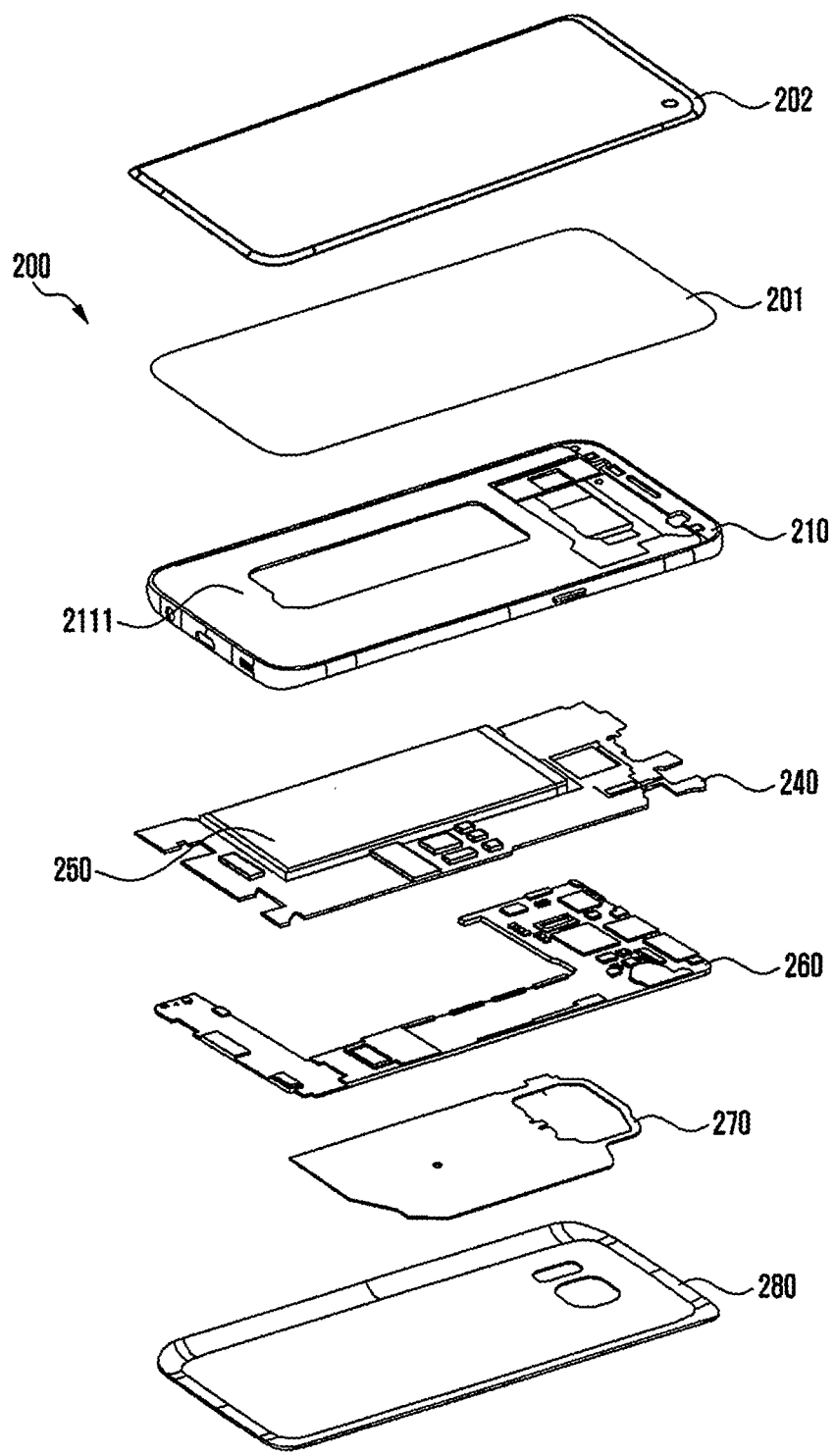
FIG. 2C is an exploded perspective view of a mobile electronic device according to an embodiment of the disclosure.

FIG. 2C illustrates an exploded perspective view showing a mobile electronic device 200 shown in FIG. 2A.

Referring to FIG. 2C, the mobile electronic device 200 may include a lateral bezel structure 210, a first support member 2111 (e.g., a bracket), a front plate 202, a display 201, an electromagnetic induction panel, a PCB 240, a battery 250, a second support member 260 (e.g., a rear case), an antenna 270, and a rear plate 280. The mobile electronic device 200 may omit at least one (e.g., the first support member 2111 or the second support member 260) of the above components or may further include another component. Some components of the electronic device 200 may be the same as or similar to those of the mobile electronic device 200 shown in FIG. 2A or FIG. 2B, thus, descriptions thereof are omitted below.

The first support member 2111 is disposed inside the mobile electronic device 200 and may be connected to, or integrated with, the lateral bezel structure 210. The first support member 2111 may be formed of, for example, a metallic material and/or a non-metal (e.g., polymer) material. The first support member 2111 may be combined with the display 201 at one side thereof and also combined with the PCB 240 at the other side thereof. On the PCB 240, a processor, a memory, and/or an interface may be mounted. The processor may include, for example, one or more of a CPU, an AP, a GPU, an ISP, a sensor hub processor, or a CP.

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the mobile electronic device 200 with an external electronic device and may include a USB connector, an SD card/multimedia card (MMC) connector, or an audio connector.

The battery 250 is a device for supplying power to at least one component of the mobile electronic device 200, and may include, for example, a non-rechargeable primary battery, a rechargeable secondary battery, or a fuel cell. At least a part of the battery 250 may be disposed on substantially the same plane as the PCB 240. The battery 250 may be integrally disposed within the mobile electronic device 200, and may be detachably disposed from the mobile electronic device 200.

The antenna 270 may be disposed between the rear plate 280 and the battery 250. The antenna 270 may include, for example, a near field communication (NFC) antenna, a wireless charging antenna, and/or a magnetic secure transmission (MST) antenna. The antenna 270 may perform short-range communication with an external device, or transmit and receive power required for charging wirelessly. An antenna structure may be formed by a part or combination of the lateral bezel structure 210 and/or the first support member 2111.

Figure 3A:
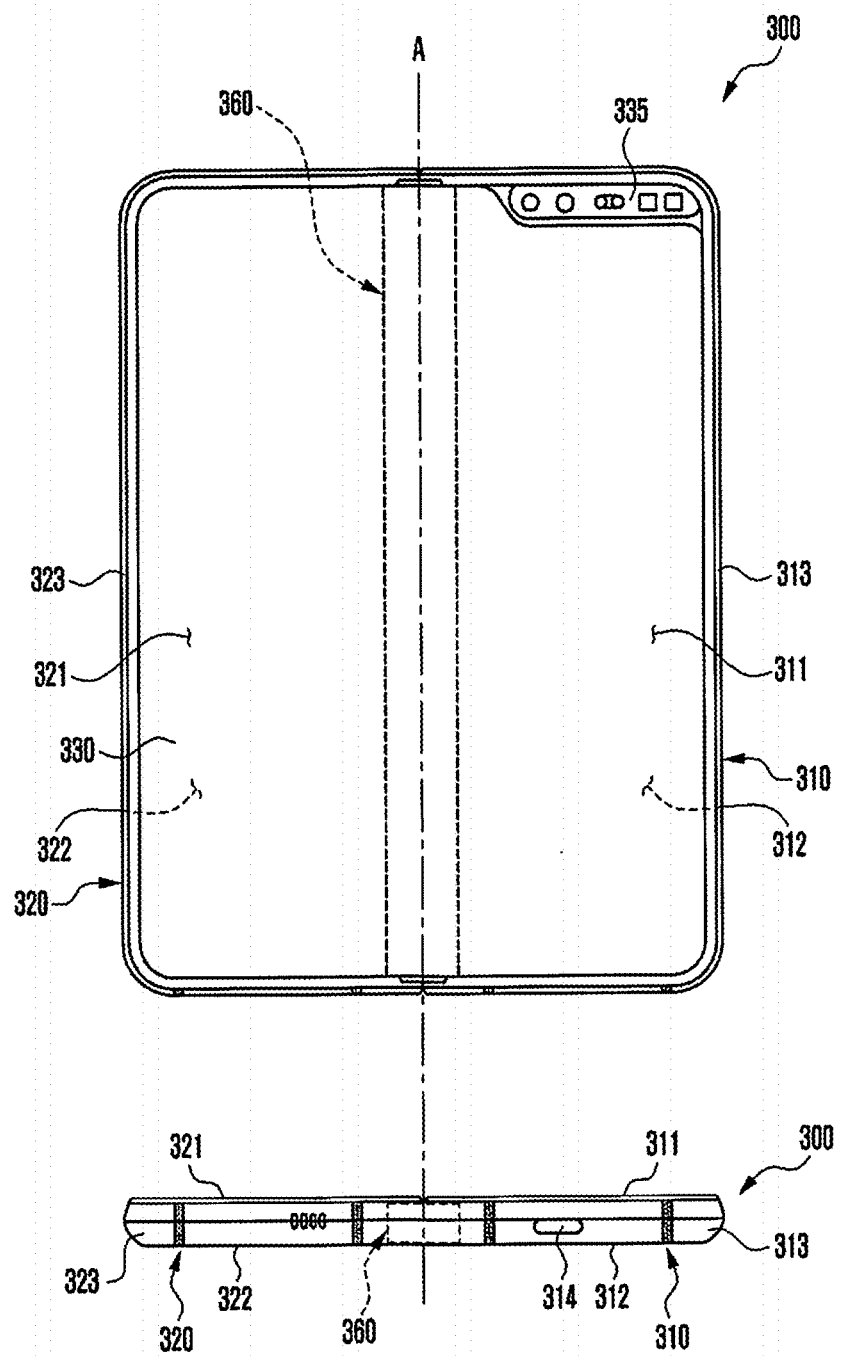
FIG. 3A is a diagram illustrating an open state of an electronic device according to an embodiment of the disclosure.
Figure 3B:
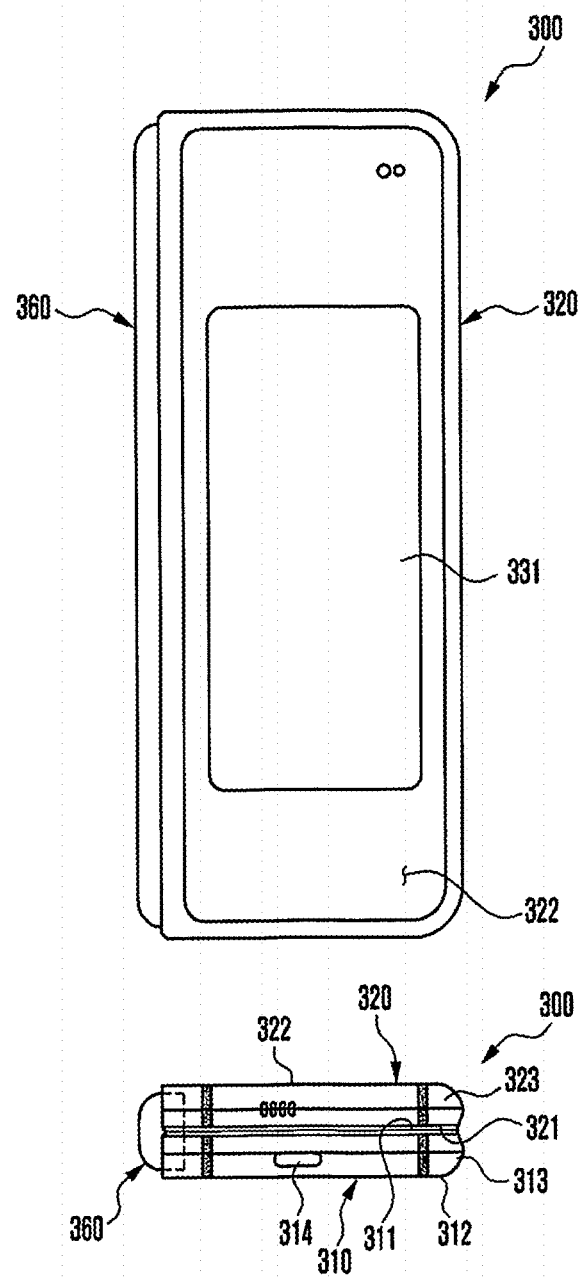
FIG. 3B is a diagram illustrating a folded state of the electronic device of FIG. 2A according to an embodiment of the disclosure.

FIG. 3A is a diagram illustrating an open state of an electronic device 300 according to an embodiment of the disclosure. FIG. 3B is a diagram illustrating a folded state of the electronic device 300 of FIG. 3A according to an embodiment of the disclosure.

The electronic device 300 of FIGS. 3A and 3B may be at least partially similar to the electronic device 101 of FIG. 1, or may include other embodiments of the electronic device.

Referring to FIGS. 3A and 3B, the electronic device 300 may include foldable housing structures disposed rotatably with respect to a folding axis A. The foldable housing structure may include a first housing structure 310 and a second housing structure 320. The first housing structure 310 and the second housing structure 320 may be rotatably connected to each other by a hinge structure 360. For example, the first housing structure 310 and the second housing structure 320 may be folded to face each other with respect to the folding axis A by the hinge structure 360 or may be opened relative to each other to have the same plane.

The first housing structure 310 may include a first surface 311 facing in a first direction, a second surface 312 facing in a second direction opposite the first direction, and a first side member 313 surrounding at least a portion of a space between the first surface 311 and the second surface 312.

The second housing structure 320 may include a third surface 321 facing in a third direction, a fourth surface 322 facing in a fourth direction opposite the third direction, and a second side member 323 surrounding at least a portion of a space between the third surface 321 and the fourth surface 322.

In a state where the first housing structure 310 and the second housing structure 320 are unfolded at 180 degrees, the first surface 311 and the third surface 321 may be formed in a planar structure facing the same direction. The electronic device 300 may include a display 330 (e.g., a flexible display) disposed to cross the first surface 311 of the first housing structure 310 and the third surface 321 of the second housing structure 320. For example, when the first surface 311 of the first housing structure 310 and the third surface 321 of the second housing structure 320 are folded to face each other, the display 330 may also be folded to face each other with respect to the folding axis A. In at least a portion of the first surface 311 of the first housing structure 310, the display 330 is not disposed and a separate sensor region 335 may be disposed. A sensor region 335 may be disposed in an at least partial region of the third surface 321 of the second housing structure 320 or disposed to extend on the first surface 311 and the third surface 321. The electronic device 300 may include a sub display 331 disposed to be visible from the outside through the fourth surface 322 of the second housing structure 320.

The first side member 313 of the first housing structure 310 may include a connector hole 314. The connector hole 314 may include a USB connector or an IF module (e.g., an interface connector port module) for transmitting and receiving power and/or data to and from an external electronic device.

Figure 4:
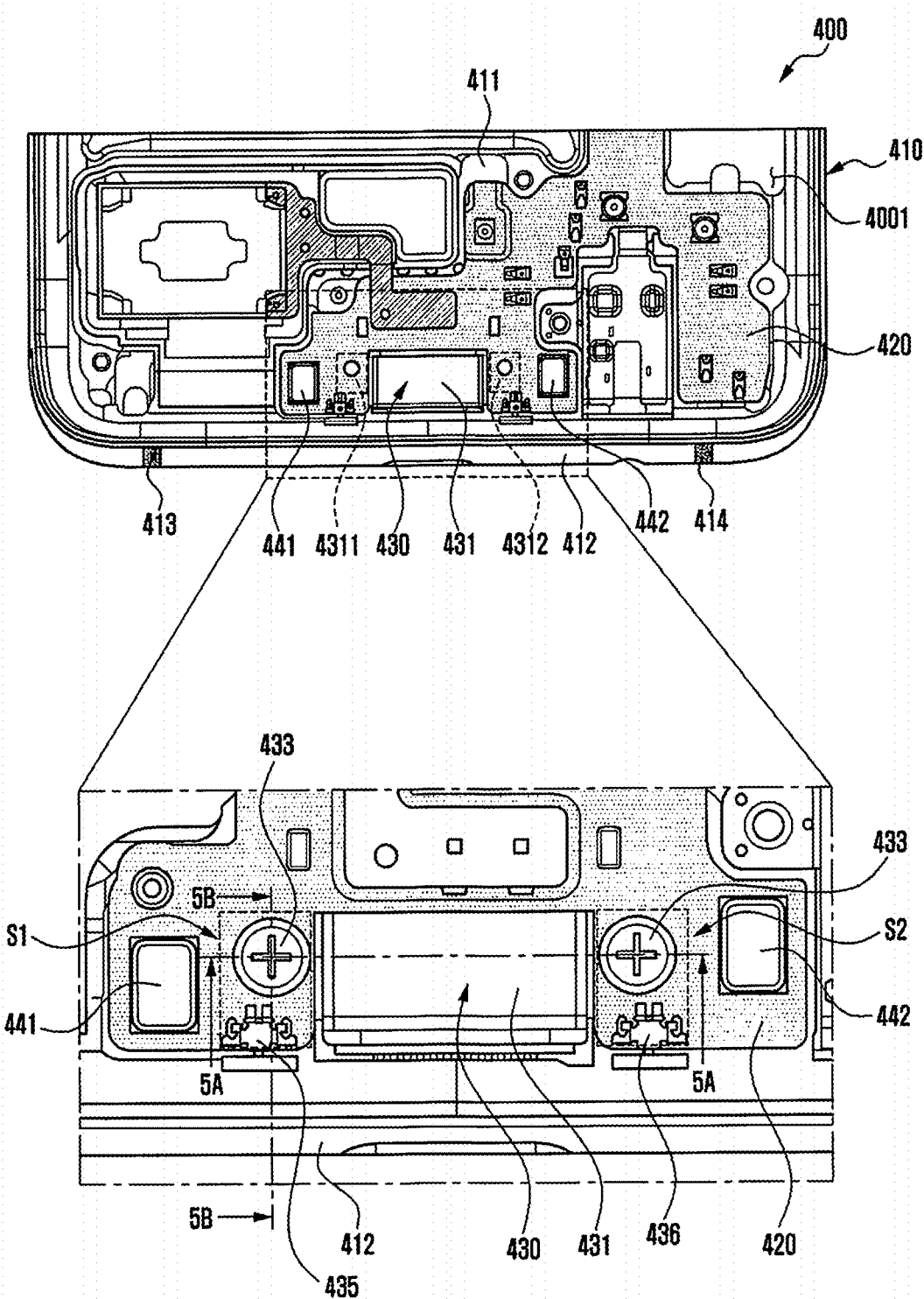
FIG. 4 is a diagram partially illustrating an electronic device in which an IF module is mounted according to an embodiment of the disclosure.

FIG. 4 is a diagram partially illustrating an electronic device 400 in which an IF module 430 is mounted according to an embodiment of the disclosure.

The electronic device 400 of FIG. 4 may be at least partially similar to the electronic device 101 of FIG. 1, the electronic device 200 of FIG. 2A, or the electronic device 300 of FIG. 3A, or may further include other embodiments of the electronic device.

Referring to FIG. 4, the electronic device 400 may include a front plate facing a first direction (e.g., the front plate 202 of FIG. 2A), a rear plate facing a direction opposite the front plate (e.g., the rear plate 211 of FIG. 2B), and a side member 410 surrounding an internal space 4001 between the front plate and the rear plate. The side member 410 may include a support member 411 (e.g., the first support member 2111 of FIG. 2C) that extends at least partially in an inner space direction. The support member 411 may be disposed by structural engagement with the side member 410. The side member 410 may include an at least partially disposed conductive member (e.g., a conductive member 4101 of FIG. 5B) and a non-conductive member (e.g., a non-conductive member 4102 of FIG. 5B) (e.g., a polymer member) coupled to the conductive member. The side member 410 may be formed by a method in which the non-conductive member 4102 is insert-injected into the conductive member 4101 or structural coupling therebetween.

The side member 410 may include a conductive portion 412 which is divided to be electrically insulated by a first non-conductive portion 413 and a second non-conductive portion 414 spaced at regular intervals. The conductive portion 412 may operate as an antenna by being electrically connected to a wireless communication circuit (e.g., the wireless communication circuit 422 of FIG. 6) disposed in the internal space 4001 of the electronic device 400.

The electronic device 400 may include a PCB 420 disposed in the internal space 4001. The PCB 420 may be disposed at least partially in proximity to the conductive portion 412 and may be electrically connected to the conductive portion 412 through one or more connection members 435 and 436. The one or more connection members 435 and 436 may include a conductive tape, a C-clip, a slide clip, or a conductive connector.

The electronic device 400 may include the IF module 430 (e.g., an interface connector port) disposed at least partially in parallel with the PCB 420 on the same plane as the PCB 420 in the internal space 4001. The IF module 430 may be disposed to be adjacent to the PCB 420 and may be electrically connected thereto. When the front plate (e.g., the front plate 202 of FIG. 2A) is viewed from above, the IF module 430 may include a connection terminal (e.g. a connection terminal 732 of FIG. 7) therein and a module housing 431 disposed in parallel with the PCB 420. When the front plate 202 is viewed from above, the IF module 430 may include a pair of extension portions 4311 and 4312 extending at least partially from the module housing 431 to overlap the PCB 420. The pair of extension portions 4311 and 4312 may include the first extension portion 4311 extending from one side of the module housing 431 and the second extension portion 4312 extending from the other side of the module housing 431 so as to face the first extension portion 4311. When the front plate 202 is viewed from above, the PCB 420 may include a first overlapping region S1 on which the first extension portion 4311 of the IF module 430 overlaps and a second overlapping region S2 on which the second extension portion 4312 thereof overlaps. Accordingly, the PCB 420 may have an expanded mounting space corresponding to the first overlapping region S1 and the second overlapping region S2. This indicates that, when the above-described one or more connection members 435 and 436 are disposed in the first overlapping region S1 and/or the second overlapping region S2, it may help to adjust the electrical length of the antenna. The first extension portion 4311 and the second extension portion 4312 may be disposed between the PCB 420 and the support member 411 in the internal space 4001 of the electronic device 400. The PCB 420 and the IF module 430 may be fixed in the first overlapping region S1 and/or the second overlapping region S2 through at least one single fastening member 433 (e.g., screws) which passes through the PCB 420 and the first extension portion 4311 and/or the second extension portion 4312 together and then is fastened to the support member 411. The first extension portion 4311 and the second extension portion 4312 of the IF module 430 may be disposed on a surface opposite a surface facing the support member 411 of the PCB 420 in the first overlapping region S1 and/or the second overlapping region S2.

The electronic device 400 may include a pair of microphone modules disposed on the PCB 420. The pair of microphone modules may include a first microphone module 441 and a second microphone module 442 disposed at both left and right sides with the IF module 430 interposed therebetween. The first microphone module 441 of the pair of microphone modules 441 and 442 may be disposed using at least a portion of the first overlapping region S1 of the PCB 420 overlapping the first extension portion 4311. The second microphone module 442 may be disposed using at least a portion of the second overlapping region S2 of the PCB 420 overlapping the second extension portion 4312

Figure 5A:
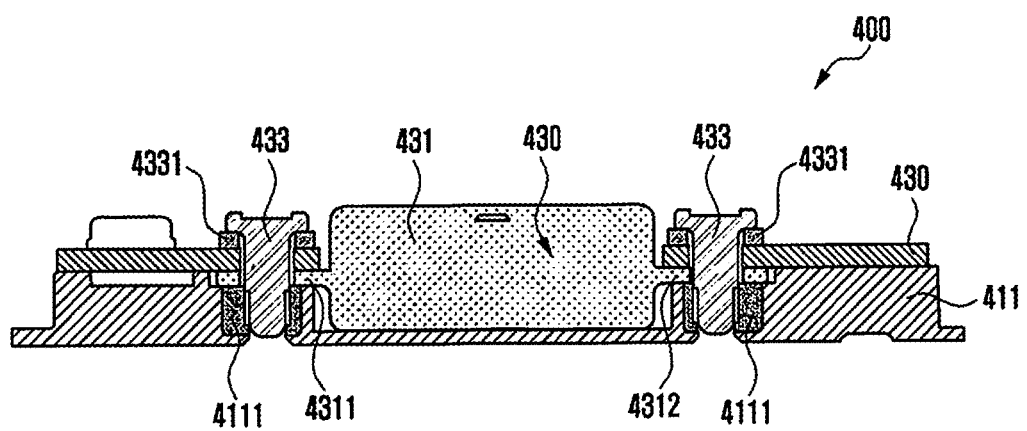
FIG. 5A is a partial cross-sectional view of the electronic device of FIG. 4 as viewed from line 5A-5A of FIG. 4 according to an embodiment of the disclosure.
Figure 5B:
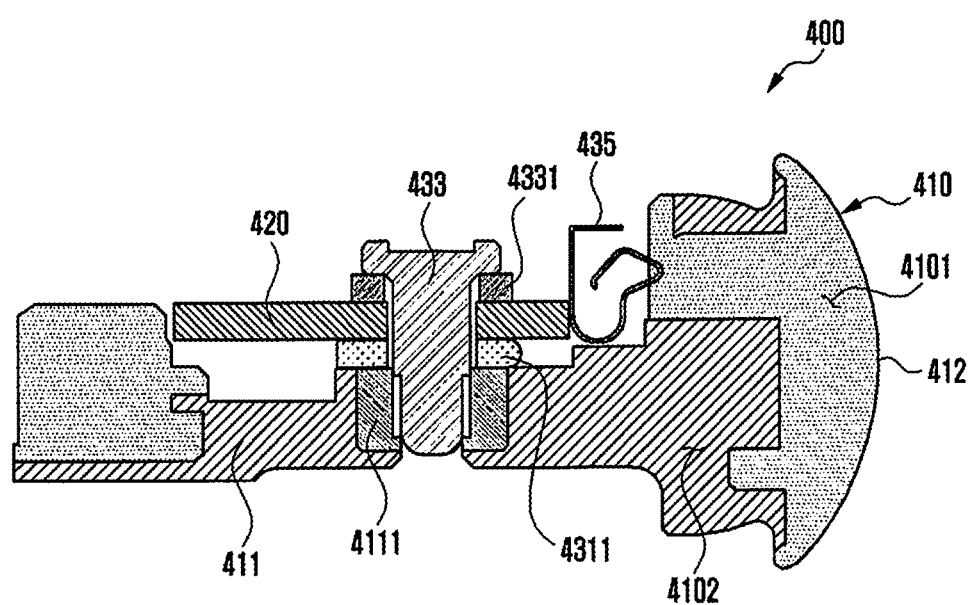
FIG. 5B is a partial cross-sectional view illustrating an electronic device as viewed from line 5B-5B of FIG. 4 according to an embodiment of the disclosure.

FIG. 5A is a partial cross-sectional view showing the electronic device 400 as viewed from line 5A-5A of FIG. 4 according to an embodiment of the disclosure. FIG. 5B is a partial cross-sectional view illustrating the electronic device 400 as viewed from line 5B-5B of FIG. 4 according to an embodiment of the present disclosure Referring to FIGS. 5A and 5B, an electronic device (e.g., the electronic device 400 of FIG. 4) may include the side member 410 and the support member 411 that extends from the side member 410 and at least partially extends to an internal space (e.g., the internal space 4001 of FIG. 4) of the electronic device 400. The side member 410 may be formed of different materials. For example, the side member 410 may be formed in such a manner that the non-conductive member 4102 (e.g., a polymer member) is insert-injected into the conductive member 4101. The internal space 4001 of the electronic device 400 may include the PCB 420 disposed to be supported by the support member 411. The PCB 420 may be electrically connected to the unit conductive portion 412 formed in the conductive member 4101 through at least one connection member 435. The conductive portion 412 may be used as an antenna by being electrically connected to the PCB 420.

The electronic device 400 may include the IF module 430 disposed in the internal space 4001. The IF module 430 may be used as an electrical connection medium for charging an internal battery using an external power source. Accordingly, the IF module 430 may be disposed to be at least partially supported by the support member 411 formed of the non-conductive member 4102 so as to remain electrically insulated from the conductive member 4101. A module housing 431 of the IF module 430 may be disposed in parallel with the PCB 420 without overlapping the PCB 420. A pair of extension portions 4311 and 4312 extending from the module housing 431 to face each other may be disposed between the support member 411 and the PCB 420. Accordingly, when the front plate (e.g., the front plate 202 of FIG. 2A) is viewed from above, the PCB 420 may include a first overlapping region (e.g., the first overlapping region S1 of FIG. 4) overlapping the first extension portion 4311 and a second overlapping region (e.g., the second overlapping region S2 of FIG. 4) overlapping the second extension portion 4312 formed therein. In the first overlapping region S1, the PCB 420 and the first extension portion 4311 may be fastened to the support member 411 through the fastening member 433 (e.g., a screw). In the second overlapping region S2, the PCB 420 and the second extension portion 4312 may be fastened to the support member 411 through the fastening member 433. For example, the support member 411 formed of the non-conductive member 4102 may include a bushing 4111 for the fastening of the fastening member 433, and the fastening member 433 such as a screw may pass through the PCB 420 and the first extension portion 4311 and/or the second extension portion 4312 and may then be fastened to the bushing 4111 of the support member 411. The fastening member 433 may pass through the PCB 420 and be fastened to the support member 411 through at least one washer member 4331. The washer member 4331 may continuously maintain the fastening force of the fastening member 433.

The PCB 420 may be electrically connected to the conductive portion 412 of the side member 410 through the connection member 435. The connection member 435 may be mounted on the PCB 420 and may be disposed to be brought into physical contact with the inner surface of the conductive portion 412. The conductive portion 412 may operate as an antenna by being electrically connected to a wireless communication circuit (e.g., a wireless communication circuit 422 of FIG. 6) and/or a ground (e.g., ground 426 of FIG. 6) of the PCB 420 in a region (the first overlapping region S1) where the PCB 420 and the first extension portion 4311 overlap each other.

Since the extension portions 4311 and 4312 of the IF module 430 are disposed to overlap at least some regions of the PCB 420 and the IF module 430 and the extension portions 4311 and 4312 are fastened together by one fastening member 433, whereby the PCB 420 may have a component mounting space that is expanded by the overlapping region (for example, the first overlapping region S1 and/or the second overlapping region S2) and the manufacturing cost can be reduced by simplifying the fastening member 433.

Figure 6:
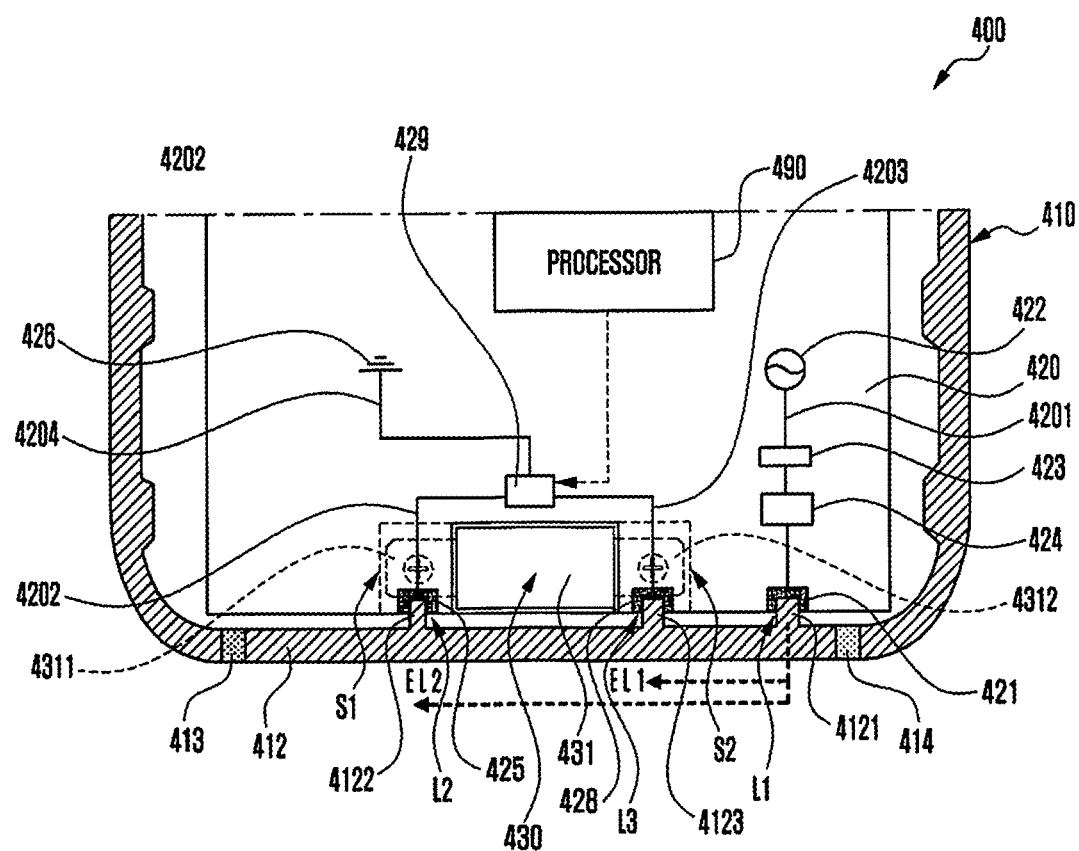
FIG. 6 is a diagram illustrating an arrangement relationship between an IF module and an antenna of an electronic device according to an embodiment of the disclosure.

FIG. 6 is a diagram illustrating an arrangement relationship between the IF module 430 and the antenna (e.g., the conductive portion 412) of the electronic device 400 according to an embodiment of the disclosure.

Referring to FIG. 6, the conductive portion 412, which is used as an antenna in at least a portion of the side member 410, may also use the overlapping regions S1 and S2 of the expanded PCB 420 as described above, thereby improving antenna radiation performance.

The electronic device 400 may include the side member 410. The side member 410 may include the unit conductive portion 412 formed by the first non-conductive portion 413 and the second non-conductive portion 414 spaced apart from each other. The conductive portion 412 may be utilized as an antenna that operates in a predetermined frequency band (e.g., a legacy band) by being electrically connected to the wireless communication circuit 422 disposed in the PCB 420.

The conductive portion 412 may include a first connection piece 4121 that extends from a first location L1 of the conductive portion 412 in a direction of the PCB 420, a second connection piece 4122 that extends from a second location L2 between the first location L1 and the first non-conductive portion 413 in the direction of the PCB 420, and a third connection piece 4123 that extends from a third location L3 between the second location L2 and the first location L1 in the direction of the PCB 420. The second connection piece 4122 and the third connection piece 4123 may be disposed to be electrically connected to the PCB 420 in a region where the second connection piece 4122 and the third connection piece 4123 overlap the pair of extension portions 4311 and 4312 that extend to face each other from the module housing 431 of the IF module 430 disposed around the PCB 420. The first connection piece 4121, the second connection piece 4122, and the third connection piece 4123 may be integrally formed with the conductive portion 412.

The PCB 420 may include a first connection portion 421 (e.g., a conductive pad) that is electrically connected to the first connection piece 4122. The PCB 420 may include a first electrical path 4201 (e.g., a wiring line) that connects from the first connection portion 421 to the wireless communication circuit 422 (e.g., a power feeder). The wireless communication circuit 422 may process a signal of a desired frequency band at the first location L1 of the conductive portion 412 that is electrically connected via the first electrical path 4201. A matching circuit 424 may be disposed in the first electrical path 4201. Since the first electrical path 4201 has a configuration in which the PCB 420 is in direct electrical contact with the side member 410 forming the appearance of the electronic device 400, the electronic device may further include an electro-static discharge (ESD) circuit 423 for preventing electric shock and discharging static electricity. The matching circuit 424 may be replaced with a variable element (e.g., a tunable integrated circuit (IC)) that shifts an operating frequency band by selectively switching a plurality of passive elements.

The PCB 420 may include a second connection portion 425 (e.g., a conductive pad) that is electrically connected to the second connection piece 4122. The PCB 420 may include a second electrical path 4202 (e.g., a wiring line) that connects from the second connection portion 425 to a switching device 429 disposed in the PCB 420.

The PCB 420 may include a third connection portion 428 (e.g., a conductive pad) that is electrically connected to the third connection piece 4123. The PCB 420 may include a third electrical path 4203 (e.g., a wiring line) that connects from the third connection portion 428 to the switching device 429.

The switching device 429 may be electrically connected to a ground (GND) 426 through a fourth electrical path 4204 formed on the PCB 420. Accordingly, the second connection piece 4122 and the third connection piece 4123 may be selectively electrically connected to the ground 426 of the PCB 420 through the switching device 429 under the control of a processor 490.

The operating frequency band of the wireless communication circuit 422 may be shifted by the second connection piece 4122 or the third connection piece 4123 which is electrically connected to the ground 426 of the PCB 420 through the switching device 429. For example, the conductive portion 412 may be operated in a first frequency band having a first electrical length EL1 when the third connection piece 4123 is electrically connected to the ground 426 through the switching device 429. When the second connection piece 4122 is electrically connected to the ground 426 through the switching device 429, the conductive portion 412 may have a second electrical length EL2 and may be operated in a second frequency band lower than the first frequency band. The wireless communication circuit 422 may be configured to transmit and receive a signal of a frequency band in a range of about 850 MHz to 3,000 MHz through the conductive member 412 in which the second connection piece 4122 and/or the third connection piece 4123 are selectively connected to the ground 426. The electronic device 400 (e.g., the processor 490) may control the switching device 429 so as to correspond to degradation of the radiation performance of the antenna due to contact of the human body (e.g., gripping of the electronic device) or contact or proximity of an adjacent conductor.

The second connection piece 4122 and the third connection piece 4123 may utilize the overlapping regions S1 and S2 of the PCB 420 on which the extension portions 4311 and 4312 of the above-described IF module 430 overlap, thereby enabling a wide frequency shift.

Figure 7:
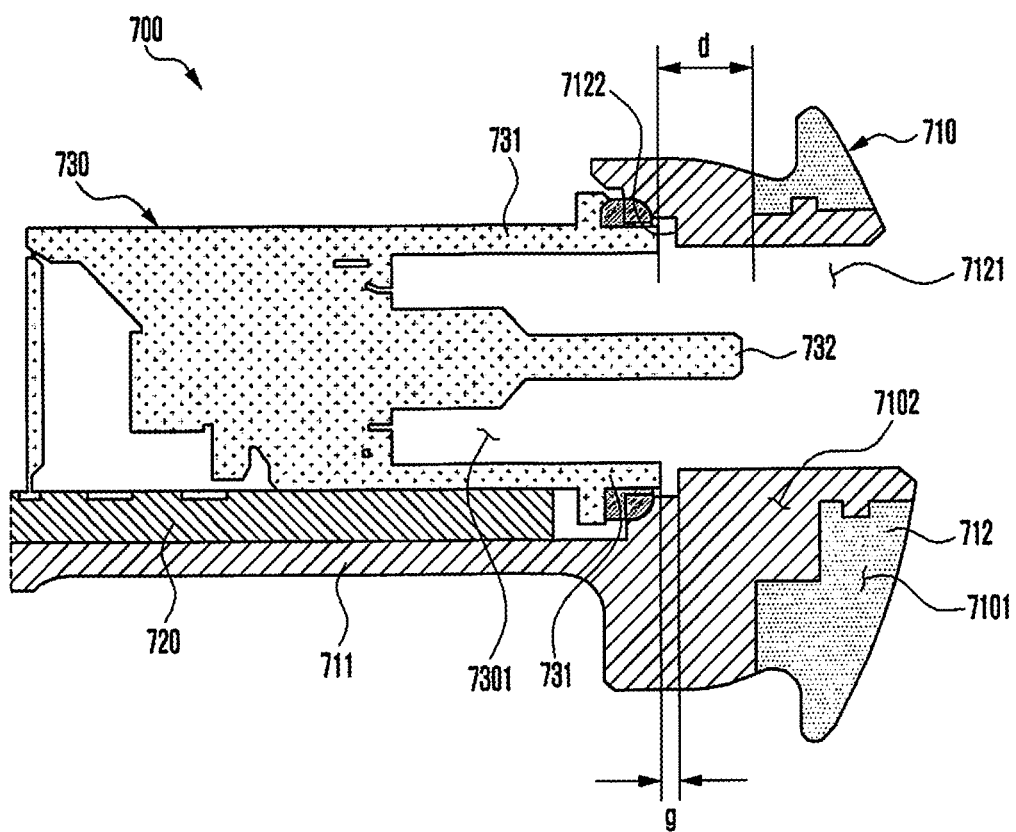
FIG. 7 is a partial cross-sectional view illustrating an electronic device having an arrangement structure of an IF module for improving radiation performance of an antenna according to an embodiment of the disclosure.

FIG. 7 is a partial cross-sectional view illustrating an electronic device 700 having an arrangement structure of an IF module 730 for improving radiation performance of an antenna according to an embodiment of the disclosure.

The electronic device 700 of FIG. 7 may be at least partially similar to the electronic device 101 of FIG. 1, the electronic device 200 of FIG. 2A, the electronic device 300 of FIG. 3A, or the electronic device 400 of FIG. 4, and may include other embodiments of the electronic device.

Referring to FIG. 7, the electronic device 700 may include a side member 710 including a conductive member 7101 and a non-conductive member 7102, and a support member 711 that extends from the side member 710 to the internal space of the electronic device 700. At least a portion of the conductive member 7101 of the side member 710 may be formed of a conductive portion 712 that operates as an antenna. The electronic device 700 may include the IF module 730 that is supported by the support member 711 and disposed to be connected to the outside through an opening 7121 formed on the side member 710. The IF module 730 may include a module housing 731 and a connection terminal 732 (e.g., a USB terminal) that protrudes from an internal space 7301 of the module housing 731 in a direction of the opening 7121. As described above, the IF module 730 may include at least one extension portion (e.g., the extension portions 4311 and 4312 of FIG. 4) that at least partially overlap the PCB 720 supported through the support member 711.

The IF module 730 may be arranged such that the end of the module housing 731 is at least partially seated on an undercut region 7122 formed to be recessed in the inner surface of the side member 710. In this case, the module housing 731 made of the conductive material may be disposed to be close to the conductive portion 712 which operates as an antenna, which may degrade the radiation performance of the conductive portion 712.

According to an embodiment, the IF module 730 may at least partially cut the end of the module housing 731 and may arrange the same to have a predetermined gap g from the undercut region 7122, so that the IF module 730 may have a maximum separation distance d with the conductive portion 712 even if it has the same arrangement position, thereby helping to improve the radiation performance of the antenna.

Figure 8A:
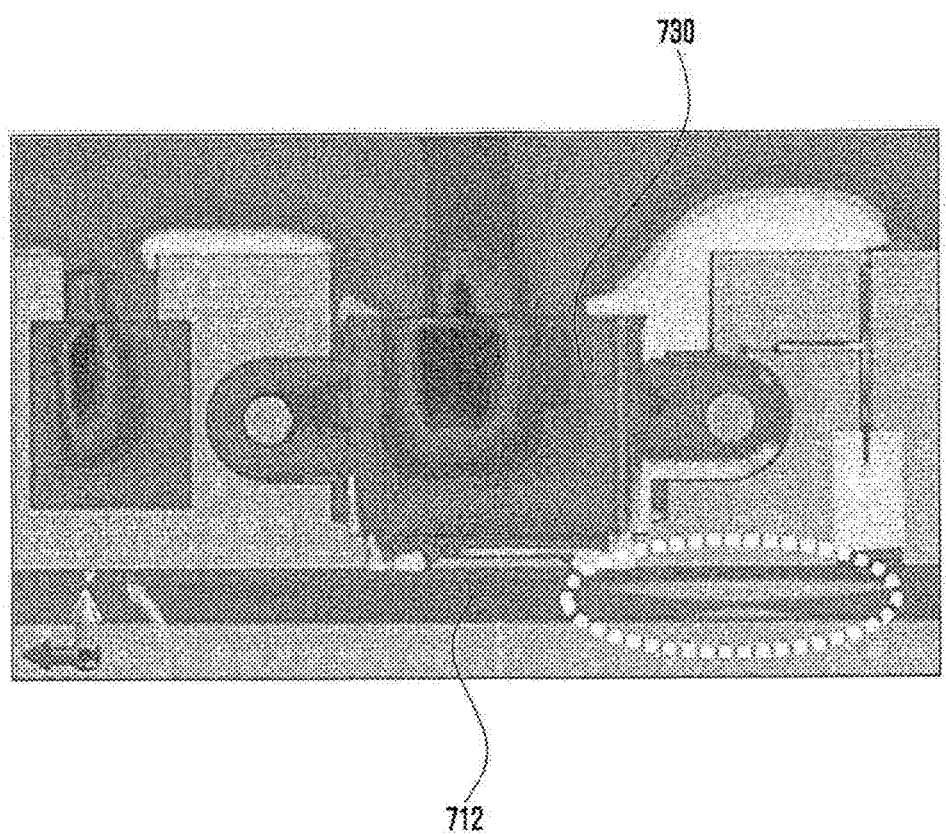
FIG. 8A is a diagram illustrating electric field distributions before and after changing an arrangement structure of an IF module according to an embodiment of the disclosure.
Figure 8B:
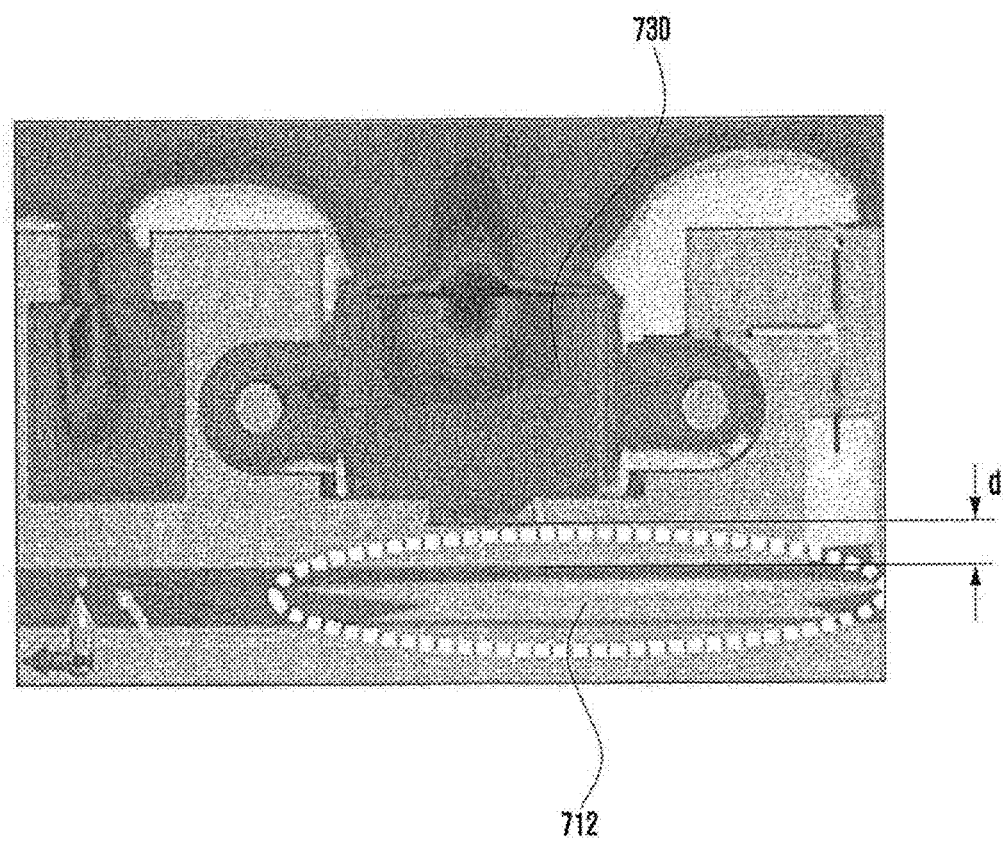
FIG. 8B is a diagram illustrating electric field distributions before and after changing an arrangement structure of an IF module according to an embodiment of the disclosure.

FIG. 8A is a diagram illustrating electric field distributions before and after changing an arrangement structure of an IF module (e.g., the IF module 730 of FIG. 7) according to an embodiment of the disclosure, and FIG. 8B is a diagram illustrating electric field distributions before and after changing an arrangement structure of an IF module (e.g., the IF module 730 of FIG. 7) according to an embodiment of the disclosure.

Referring to FIGS. 8A and 8B, when an IF module (e.g., the IF module 730 of FIG. 7) is arranged in proximity to a conductive portion (e.g., the conductive portion 712 of FIG. 7), the current of the conductive portion 712 is undesirably induced in a direction of the IF module. On the other hand, as shown in FIG. 8B, when a portion of the module housing (e.g., the module housing 731 of FIG. 7) is cut so that a separation distance (e.g., the separation distance d of FIG. 7) between the IF module 730 and the conductive portion 712 is relatively great, the current is induced only to the conductive portion 412. This may indicate that the conductive portion 712 operates smoothly in a desired frequency band without being affected by the adjacent conductor.

Figure 9:
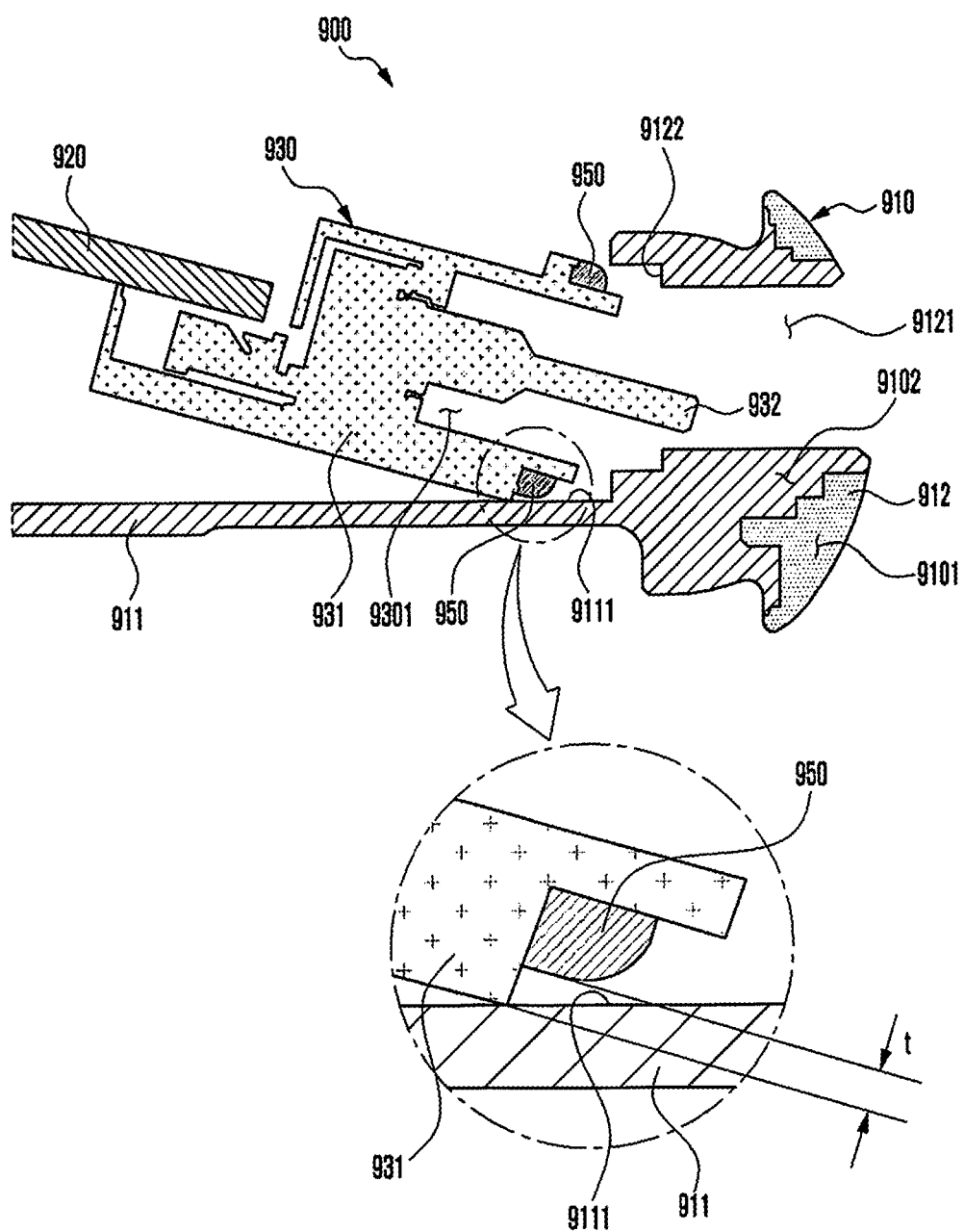
FIG. 9 is a partial cross-sectional view illustrating an electronic device having an arrangement structure of an IF module in consideration of a waterproof member according to an embodiment of the disclosure.

FIG. 9 is a partial cross-sectional view illustrating an electronic device 900 having an arrangement structure of an IF module 930 in consideration of a waterproof member 950 according to an embodiment of the disclosure.

The electronic device 900 of FIG. 9 may be at least partially similar to the electronic device 101 of FIG. 1, the electronic device 200 of FIG. 2A, the electronic device 300 of FIG. 3A, the electronic device 400 of FIG. 4, or the electronic device 700 of FIG. 7, and may include other embodiments of the electronic device.

Referring to FIG. 9, the electronic device 900 may include a side member 910 configured to include a conductive member 9101 and a non-conductive member 9102, and a support member 911 configured to extend from the side member 910 to an internal space of the electronic device 900. At least a portion of the conductive member 9101 of the side member 910 may be formed of a conductive portion 912 operating as an antenna. The electronic device 900 may include the IF module 930 configured to be supported through the support member 911 and to be disposed to be connected to the outside through an opening 9121 formed in the side member 910. The IF module 930 may include a module housing 931 and a connection terminal 932 (e.g., a USB terminal) that protrudes from an internal space 9301 of the module housing 931 in a direction of the opening 9121. As described above, the IF module 930 may include at least one extension portion (e.g., the extension portions 4311 and 4312) that at least partially overlaps a PCB 920 supported through the support member 911.

The IF module 930 may be arranged such that the end of the module housing 931 is at least partially seated on an undercut region 9122 formed to be recessed in the inner surface of the side member 910. In this case, a waterproof member 950 for waterproofing and/or dustproofing may be interposed between the module housing 931 and an undercut region 9122. The waterproof member 950 may include at least one of tape, an adhesive, waterproof dispensing, silicone, waterproof rubber, or urethane.

When the IF module 930 is mounted in the undercut region 9122, the IF module 930 may be mounted with a predetermined inclination with respect to the support member 911, and may then be finally disposed parallel to the support member 911. During this process, the waterproof member 950 applied or disposed at the end of the module housing 931 of the IF module 930 may be damaged by a surface 9111 of the support member 911, thereby reducing a desired waterproofing and/or dustproofing function.

At least a portion of the end of the module housing 931 may sufficiently accommodate the waterproof member 950. During assembly, even though the IF module 930 is brought into contact with the support member 911 in an inclined manner, the waterproof member 950 may be formed to have an additional thickness t such that the waterproof member 950 is not damaged by the surface 9111 of the support member 911.

By the arrangement structure of electronic components according to various embodiments of the disclosure, the component mounting space of the PCB may be expanded and the electronic component and the PCB may be simultaneously fixed by the single fastening member to reduce the manufacturing costs. In addition, it is possible to improve the radiation performance of the antenna by enlarging the electrical connection area of the adjacent antenna with respect to the PCB.

According to an embodiment, an electronic device may include a housing configured to include a front plate, a rear plate facing in a direction opposite the front plate, and a side member having a support member surrounding a space between the front plate and the rear plate and at least partially extending to the space; a printed circuit board configured to be disposed between the rear plate and the support member; an electrical structure configured to be disposed around the PCB and to include at least one extension portion at least partially overlapping the PCB when the front plate is viewed from above; and at least one fastening member configured to simultaneously pass through the at least one extension portion and the PCB and to be fastened to the support member.

The at least one extension portion may be disposed between the PCB and the support member.

The fastening member may be disposed in an overlapping region where the at least one extension portion and the PCB overlap each other.

The side member may include a conductive member and a non-conductive member coupled to the conductive member, and the electrical structure may be disposed in the support member formed of the non-conductive member.

The PCB may be disposed to be insulated from the conductive member through the support member formed of the non-conductive member.

The fastening member may include at least one screw that passes through the PCB and the at least one extension portion and is fastened to the support member.

At least one washer member may be interposed between the PCB and the screw.

The side member may include a conductive portion formed by a first non-conductive portion and a second non-conductive portion spaced apart from each other, and the conductive portion may operate as an antenna by being electrically connected to a wireless communication circuit disposed on the PCB at a first location.

The conductive portion may be disposed on the PCB in a second location spaced apart from the first location and a third location between the first location and the second location, and may be electrically connected to a switching device electrically connected to a ground.

At least one location of the second location and the third location may be included in an overlapping region of the at least one extension portion and the PCB.

An operating frequency band of the wireless communication circuit may be determined through the conductive portion in which the first location or the second location is selectively connected to the ground through the switching device.

The wireless communication circuit may be configured to transmit and receive a signal of a frequency band in a range of about 850 MHz to 3,000 MHz through the conductive portion.

The electrical structure may include an IF module, an ear jack module, a speaker module, or a microphone module.

The electronic device may further include a display configured to be disposed to be at least partially visible from the outside through the front plate in the internal space.

According to various embodiments, an electronic device may include a side member configured to include a support member at least partially extending from a side surface to an internal space of the electronic device; a PCB configured to be disposed to be supported by the support member in the internal space; an IF module configured to be disposed around the PCB and to include at least one extension portion at least partially overlapping the PCB; and at least one fastening member configured to simultaneously pass through the at least one extension portion and the PCB and then be fastened to the support member, wherein the at least one fastening member is disposed in an overlapping region where the at least one extension portion and the PCB overlap each other.

The at least one extension portion may be disposed between the PCB and the support member.

The side member may include a conductive member and a non-conductive member coupled to the conductive member, and the IF module may be disposed to be insulated from the conductive member through the support member formed of the non-conductive member.

The side member may include a conductive portion formed by a first non-conductive portion and a second non-conductive portion spaced apart from each other, and the conductive portion may operate as an antenna by being electrically connected to a wireless communication circuit disposed on the PCB at a first location.

An operating frequency band of the wireless communication circuit may be determined such that the conductive portion is electrically connected to ground of the PCB in at least one location spaced apart from the first location.

The at least one location is included in an overlapping region where the at least one extension portion and the PCB overlap each other.

The embodiments of the present disclosure and the accompanying drawings are only examples in order to easily describe the present disclosure and facilitate comprehension of the present disclosure, but are not intended to limit the scope of the present disclosure. Therefore, in addition to the embodiments disclosed herein, the scope of the present disclosure should be construed to include all modifications or modified forms drawn based on the present disclosure and is defined by the appended claims and their equivalents.

What is claimed is:

1. An electronic device, comprising:
 a housing comprising a front plate, a rear plate facing in a direction opposite the front plate, and a side member surrounding a space between the front plate and the rear plate, wherein the side member comprises a support member at least partially extending to the space;
 a printed circuit board disposed between the rear plate and the support member;
 an electrical structure coupled to the printed circuit board and comprising at least one extension portion at least partially overlapping the printed circuit board when the front plate is viewed from above; and
 at least one fastening member configured to pass through the at least one extension portion and the printed circuit board and fasten to the support member,
 wherein the at least one extension portion is disposed between the printed circuit board and the support member.

2. The electronic device of claim 1, wherein the at least one fastening member is disposed in an overlapping region where the at least one extension portion and the printed circuit board overlap each other.

3. The electronic device of claim 1, wherein
 the side member further comprises a conductive member and a non-conductive member coupled to the conductive member, and
 the electrical structure is disposed in the support member formed of the non-conductive member.

4. The electronic device of claim 3, wherein the printed circuit board is disposed to be insulated from the conductive member through the support member formed of the non-conductive member.

5. The electronic device of claim 1, wherein the at least one fastening member comprises at least one screw that passes through the printed circuit board and the at least one extension portion and fastens to the support member.

6. The electronic device of claim 5, wherein at least one washer member is interposed between the printed circuit board and the at least one screw.

7. The electronic device of claim 1, wherein
 the side member comprises a conductive portion formed by a first non-conductive portion and a second non-conductive portion spaced apart from each other, and
 the conductive portion is configured as an antenna by being electrically connected to a wireless communication circuit disposed on the printed circuit board at a first location.

8. The electronic device of claim 7, wherein the conductive portion is disposed on the printed circuit board in a second location spaced apart from the first location and a third location between the first location and the second location, and is electrically connected to a switching device electrically connected to a ground.

9. The electronic device of claim 7, wherein at least one location of the second location and the third location is in an overlapping region of the at least one extension portion and the printed circuit board.

10. The electronic device of claim 7, wherein an operating frequency band of the wireless communication circuit is determined through the conductive portion in which the first location or the second location is selectively connected to a ground through the switching device.

11. The electronic device of claim 10, wherein the wireless communication circuit is configured to transmit and receive a signal of a frequency band in a range of about 850 MHz to 3,000 MHz through the conductive portion.

12. The electronic device of claim 1, wherein the electrical structure comprises an interface connector (IF) module, an ear jack module, a speaker module, or a microphone module.

13. The electronic device of claim 1, further comprising:
a display disposed to be at least partially visible from outside of the electronic device through the front plate in the space.

14. An electronic device, comprising:
a side member comprising a support member at least partially extending from a side surface to an internal space of the electronic device;
a printed circuit board disposed to be supported by the support member in the internal space;
a connector module coupled to the printed circuit board and comprising at least one extension portion at least partially overlapping the printed circuit board; and
at least one fastening member configured to pass through the at least one extension portion and the printed circuit board and fasten to the support member,
wherein the at least one fastening member is disposed in an overlapping region where the at least one extension portion and the printed circuit board overlap each other, and
wherein the at least one extension portion is disposed between the printed circuit board and the support member.

15. The electronic device of claim 14, wherein
the side member further comprises a conductive member and a non-conductive member coupled to the conductive member, and
the connector module is disposed to be insulated from the conductive member through the support member formed of the non-conductive member.

16. The electronic device of claim 14, wherein
the side member further comprises a conductive portion formed by a first non-conductive portion and a second non-conductive portion spaced apart from each other, and
the conductive portion is configured as an antenna by being electrically connected to a wireless communication circuit disposed on the printed circuit board at a first location.

17. The electronic device of claim 16, wherein an operating frequency band of the wireless communication circuit is determined such that the conductive portion is electrically connected to a ground of the printed circuit board in at least one location spaced apart from the first location.

18. The electronic device of claim 17, wherein the at least one location is in an overlapping region where the at least one extension portion and the printed circuit board overlap each other.

19. An electronic device, comprising:
a housing comprising a front plate and a rear plate;
a support member disposed between the first plate and the rear plate;
a display disposed between the front plate and the support member;
a printed circuit board disposed between the support member and the rear plate, the printed circuit board having a cutout portion;
a USB connector including a module housing, a first extension portion and a second extension portion, the module housing disposed in the cutout portion of the printed circuit board;
a first fastening member configured to fasten the printed circuit board and the first extension portion to the support member; and
a second fastening member configured to fasten the printed circuit board and the second extension portion to the support member,
wherein the first extension portion and the second extension portion are disposed between the printed circuit board and the support member.

20. An electronic device, comprising:
a housing comprising a front plate and a rear plate;
a support member disposed between the first plate and the rear plate;
a display disposed between the front plate and the support member;
a printed circuit board disposed between the support member and the rear plate, the printed circuit board having a cutout portion; and
a USB connector including a module housing, a first extension portion and a second extension portion, the module housing disposed in the cutout portion of the printed circuit board,
wherein the printed circuit board and the first extension portion are fastened to the support member and the printed circuit board and the second extension portion are fastened to the support member via fastening members such that the first extension portion and the second extension portion are disposed between the printed circuit board and the support member.

* * * * *